United States Patent
Kawabata et al.

(10) Patent No.: US 9,768,217 B2
(45) Date of Patent: Sep. 19, 2017

(54) SOLID-STATE IMAGE SENSING DEVICE AND CAMERA WITH ASYMETRIC MICROLENSES

(71) Applicant: CANON KABUSHIKI KAISHA, Tokyo (JP)

(72) Inventors: Kazunari Kawabata, Kawasaki (JP); Taro Kato, Kawasaki (JP); Yasuhiro Sekine, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 14/836,124

(22) Filed: Aug. 26, 2015

(65) Prior Publication Data

US 2016/0071896 A1     Mar. 10, 2016

(30) Foreign Application Priority Data

Sep. 9, 2014 (JP) .................. 2014-183495

(51) Int. Cl.
  *H04N 5/225*     (2006.01)
  *H01L 27/146*    (2006.01)
  *H04N 5/335*     (2011.01)

(52) U.S. Cl.
  CPC .... *H01L 27/14627* (2013.01); *H01L 27/1463* (2013.01); *H01L 27/14605* (2013.01); *H01L 27/14621* (2013.01); *H01L 27/14623* (2013.01); *H01L 27/14629* (2013.01); *H04N 5/335* (2013.01)

(58) Field of Classification Search
  CPC combination set(s) only.
  See application file for complete search history.

(56) References Cited

U.S. PATENT DOCUMENTS

| | | | |
|---|---|---|---|
| 7,119,319 B2 * | 10/2006 | Noto | H01L 27/14621 250/208.1 |
| 7,202,103 B2 | 4/2007 | Sekine et al. | |
| 8,274,586 B2 * | 9/2012 | Katsuno | G02B 3/0056 348/294 |
| 8,514,309 B2 | 8/2013 | Kato et al. | |
| 8,670,051 B2 | 3/2014 | Kato | |

(Continued)

FOREIGN PATENT DOCUMENTS

| | | |
|---|---|---|
| JP | 2006-261247 A | 9/2006 |
| JP | 2006-261249 A | 9/2006 |
| JP | 2009-004814 A | 1/2009 |

*Primary Examiner* — Gary C Vieaux
(74) *Attorney, Agent, or Firm* — Fitzpatrick, Cella, Harper & Scinto

(57) ABSTRACT

A solid-state image sensing device including a pixel array including a plurality of pixels, wherein each pixel comprises a photoelectric conversion portion arranged in a substrate and a microlens arranged thereon, an insulating member is arranged between the substrate and the microlens, each pixel further comprises a light-guide portion configured to guide incident light to the photoelectric conversion portion, the pixel array includes a central region and a peripheral region, in a pixel located in the peripheral region, the microlens is arranged while being shifted to a side of the central region with respect to the photoelectric conversion portion, and, on a cross section along the shift direction, the microlens has a left-right asymmetric shape and a highest portion of the microlens is located on the side of the central region.

16 Claims, 11 Drawing Sheets

(56) References Cited

U.S. PATENT DOCUMENTS

| | | | |
|---|---|---|---|
| 8,885,082 B2 | 11/2014 | Noda et al. | |
| 9,093,345 B2 | 7/2015 | Kato et al. | |
| 9,285,510 B2* | 3/2016 | Kawabata | G02B 3/0056 |
| 2004/0070039 A1 | 4/2004 | Sekine et al. | |
| 2006/0027825 A1* | 2/2006 | Kuriyama | H01L 27/14685 257/98 |
| 2006/0170810 A1* | 8/2006 | Kim | G02B 3/0018 348/340 |
| 2012/0200751 A1* | 8/2012 | Kato | H01L 27/14627 348/294 |
| 2014/0035086 A1 | 2/2014 | Kato | |
| 2014/0145287 A1 | 5/2014 | Kato | |
| 2014/0300788 A1 | 10/2014 | Sekine | |
| 2015/0109501 A1 | 4/2015 | Sekine | |
| 2015/0264287 A1 | 9/2015 | Shimotsusa et al. | |

\* cited by examiner

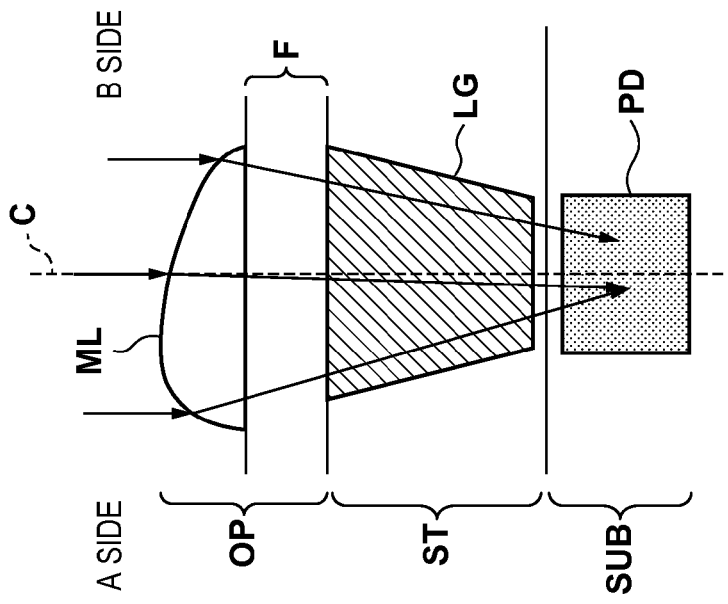
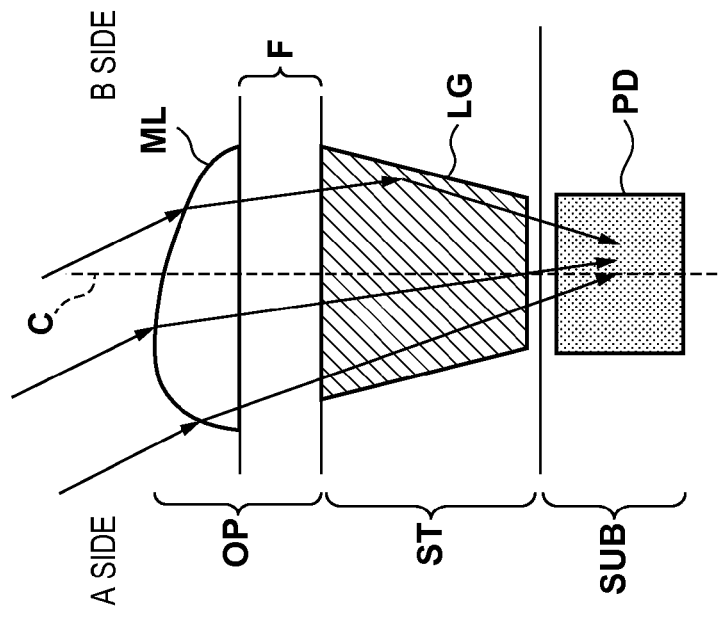

F I G. 6A
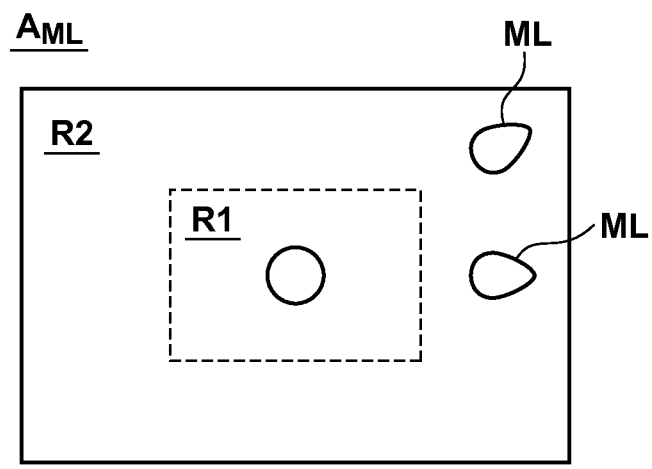
F I G. 6B
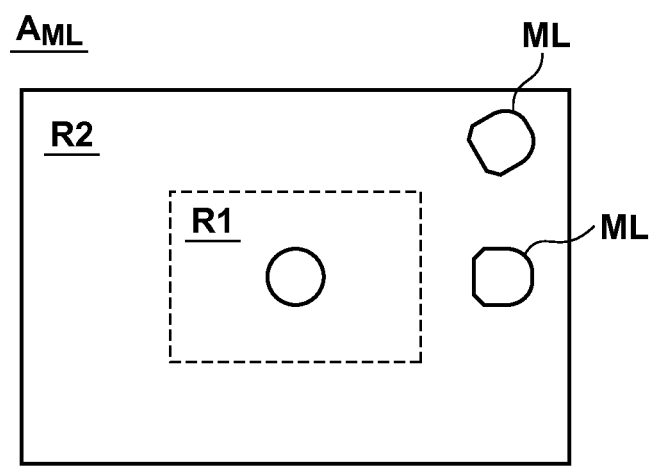

F I G. 7A
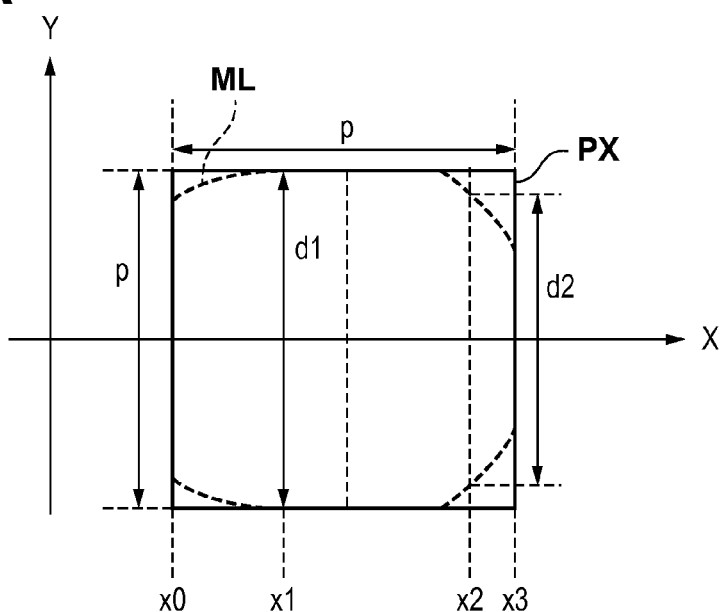
F I G. 7B
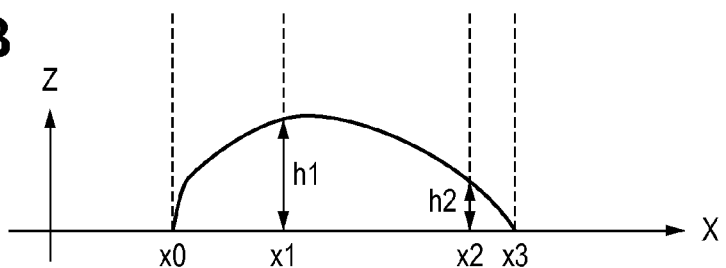

SOLID-STATE IMAGE SENSING DEVICE AND CAMERA WITH ASYMETRIC MICROLENSES

BACKGROUND OF THE INVENTION

Field of the Invention

The present invention relates to a solid-state image sensing device and a camera.

Description of the Related Art

Japanese Patent Laid-Open No. 2006-261247 discloses a solid-state image sensing device including a pixel array in which a plurality of pixels are arranged. Each pixel includes a photoelectric conversion portion formed on a substrate, a light-guide portion arranged on the photoelectric conversion portion, and a microlens arranged on the light-guide portion. Incident light that has passed through the microlens is guided to the photoelectric conversion portion by the light-guide portion.

The incident light to a pixel includes a perpendicularly incident light (light having a relatively small inclined angle) component and an obliquely incident light (light having a relatively large inclined angle) component. In general, the obliquely incident light component is larger in the peripheral region of the pixel array than in the central region. According to the structure described in Japanese Patent Laid-Open No. 2006-261247, the microlenses each having an arcuated section and the light-guide portions are arranged while being shifted with respect to the photoelectric conversion portions in accordance with the positions of the pixels in the pixel array (for example, FIGS. 1 and 2A).

In the structure described in Japanese Patent Laid-Open No. 2006-261247 (the structure in which the microlenses are shifted), however, perpendicularly incident light may be off the light-guide portion and undetectable (or become stray light), although obliquely incident light is guided by the light-guide portion and detected. On the other hand, in a structure in which the microlenses are not shifted, obliquely incident light may be off the light-guide portion and undetectable (or become stray light), although perpendicularly incident light is guided by the light-guide portion and detected.

SUMMARY OF THE INVENTION

It is an object of the present invention to provide a technique advantageous in detecting both perpendicularly incident light and obliquely incident light and improving pixel sensitivity.

One of the aspects of the present invention provides a solid-state image sensing device including a pixel array in which a plurality of pixels are arranged, wherein each of the plurality of pixels comprises: a photoelectric conversion portion arranged in a substrate; a microlens arranged on the photoelectric conversion portion; an insulating member arranged between the substrate and the microlens; and a light-guide portion configured to guide incident light that has passed through the microlens to the photoelectric conversion portion, the light-guide portion being formed in the insulating member and made of a material having a refractive index higher than a refractive index of the insulating member, the pixel array including a central region and a peripheral region, in a pixel located in the peripheral region, the microlens being arranged while being shifted to a side of the central region with respect to the photoelectric conversion portion, and the microlens having a left-right asymmetric shape on a cross section along the shift direction, and a highest portion of the microlens is located on the side of the central region.

Further features of the present invention will become apparent from the following description of exemplary embodiments with reference to the attached drawings.

BRIEF DESCRIPTION OF THE DRAWINGS

FIGS. 4A and 4B are schematic views for explaining an example of optical paths of incident light in an example of the pixel structure;

FIGS. 6A and 6B are schematic views for explaining examples of the shape of a microlens;

FIGS. 7A and 7B are schematic views for explaining an example of the shape of a microlens;

DESCRIPTION OF THE EMBODIMENTS

First Embodiment

A solid-state image sensing device IA (to be referred to as a "device IA" hereinafter) according to the first embodiment will be described with reference to FIGS. 1A to 7B.

Figure 1A:
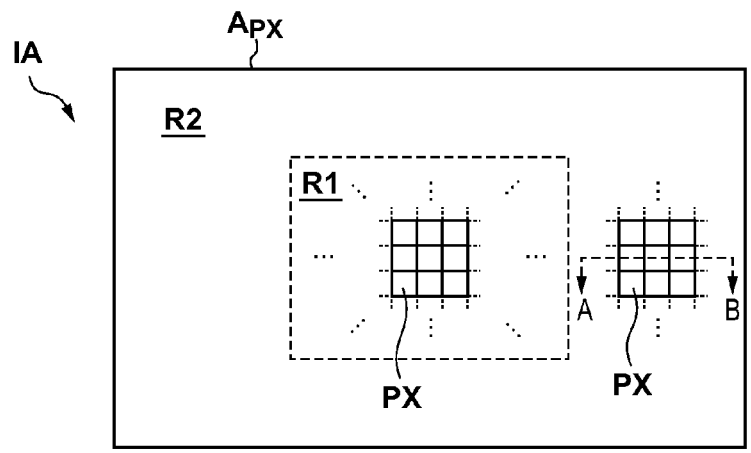
FIGS. 1A and 1B are schematic views for explaining an example of the arrangement and pixel structure of a solid-state image sensing device.

FIG. 1A shows an example of the arrangement of the device IA. The device IA includes, for example, a pixel array $A_{PX}$ in which a plurality of pixels PX are arranged, a driving unit (not shown) configured to drive the plurality of pixels PX, and a readout unit (not shown) configured to read out signals from the plurality of pixels PX. The signal of each pixel PX driven by the driving unit is read out by the readout unit and output to the outside.

The pixel array $A_{PX}$ includes a central region R1 and a peripheral region R2. The central region R1 includes the center of the pixel array $A_{PX}$ and a vicinity thereof, and the peripheral region R2 is a region other than the central region R1. The boundary between the regions R1 and R2 can arbitrarily be set.

Figure 1B:
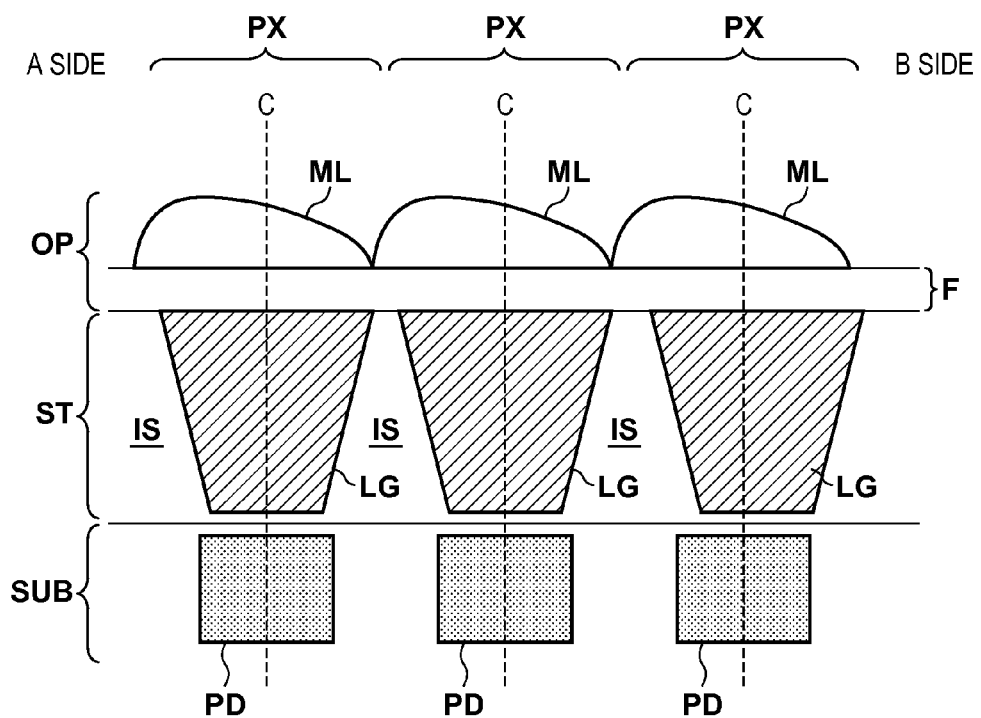

FIG. 1B shows a cross sectional structure of the pixels PX (three pixels) in the peripheral region R2 taken along a cut line A-B as an example of the structure of the pixels PX in a cross section along a row direction. The cut line A-B can be set in an arbitrary one of directions from the center of the pixel array $A_{PX}$ to the outer edge of the pixel array $A_{PX}$. Each pixel PX includes, for example, a photoelectric conversion portion PD formed in a substrate SUB such as a semiconductor substrate, a light-guide portion LG formed on the photoelectric conversion portion PD and configured to guide incident light to the photoelectric conversion portion PD, and a microlens ML formed on the light-guide portion LG and configured to condense the incident light. The pixel PX also includes an element (not shown) such as a transistor formed on the substrate SUB and configured to read a signal corresponding to charges generated by the photoelectric conversion portion PD and accumulated.

For example, the light-guide portion LG is formed in an insulating member IS formed on the substrate SUB, and made of a material having a refractive index higher than that of the insulating member IS. The insulating member IS is made of, for example, silicon oxide and formed by, for example, stacking a plurality of silicon oxide layers. The light-guide portion LG is made of, for example, silicon nitride. Note that signal lines (not shown) and the like configured to drive or control the pixels PX may be arranged between the silicon oxide layers and between the light-guide portions LG adjacent to each other. The above-described structure is represented by "ST" in FIG. 1B.

For example, a translucent member F such as a color filter is arranged on the structure ST. The microlenses ML are arranged on the translucent member F. A planarization film may be arranged between the structure ST and the translucent member F or between the translucent member F and the microlenses ML. The above-described optical system is represented by "OP" in FIG. 1B.

The microlenses ML are arranged while being shifted to the side of the central region R1 (A side in FIG. 1B, which will simply be referred to as "A side" hereinafter, whereas the side opposite to the A side will sometimes simply be referred to as "B side") with respect to the photoelectric conversion portions PD. That is, the center of each microlens ML on the above-described cross section along the cut line A-B is shifted from the center of a corresponding photoelectric conversion portion PD to the side of the center of the pixel array $A_{PX}$ along the cut line A-B. In another expression, when a line that is perpendicular to the upper surface of the substrate SUB and passes through the center of the photoelectric conversion portion PD is defined as a "line C", the distance from the A-side end of the microlens ML to the line C is longer than the distance from the B-side end of the microlens ML to the line C. In addition, the microlens ML is formed to be left-right asymmetric such that its top (highest point) is shifted to the A side. In another expression, the microlens ML is formed with its top (highest point) located close to the A side.

Note that the center of the above-described photoelectric conversion portion PD is the center between one end and the other end of the photoelectric conversion portion PD defined by an element isolation portion such as STI on the cross section along the cut line A-B. When the microlens ML is in contact with an adjacent microlens ML, the A- or B-side end of the microlens ML is the lowest portion of the concave upper surface formed between the microlens ML and the adjacent microlens ML.

Figure 2A:
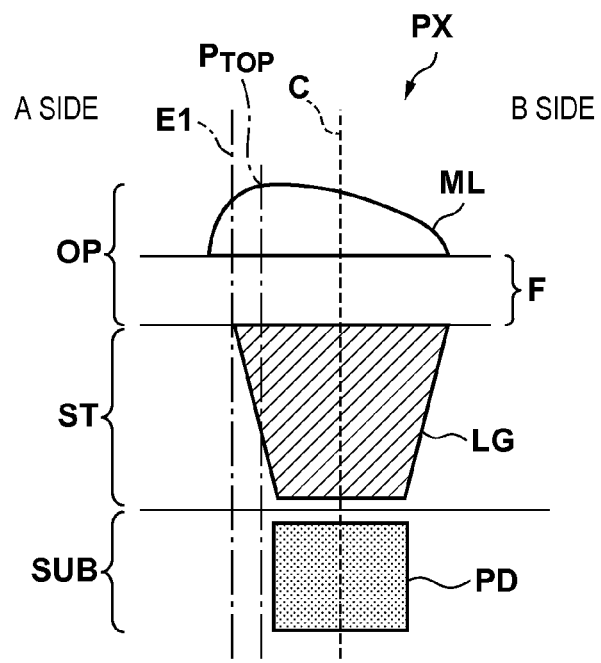
FIGS. 2A to 2C are schematic views for explaining an example of the pixel structure.

A top $P_{TOP}$ of the microlens ML is preferably located, for example, inside from the outer edge of the light-guide portion LG when viewed from the upper side (when the upper surface of the substrate SUB is viewed from the upper side or in the orthogonal projection of the components to the substrate SUB) such that incident light to the microlens ML is appropriately refracted toward the light-guide portion LG. That is, as shown in FIG. 2A, when a line that is perpendicular to the upper surface of the substrate SUB and passes through the A-side end of the upper surface of the light-guide portion LG is defined as a line E1, the top $P_{TOP}$ is preferably located on the B side of the line E1.

Figure 2B:
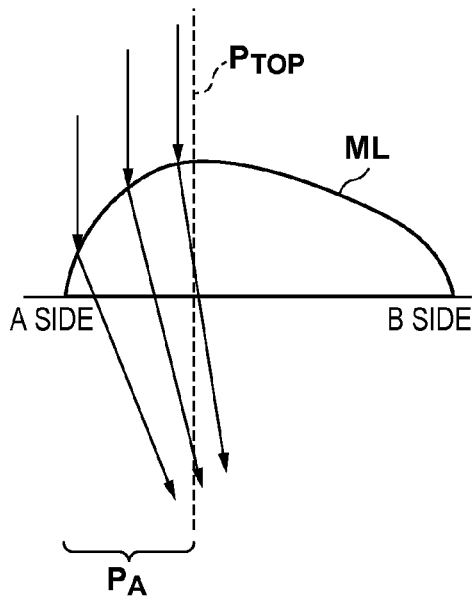
Figure 2C:
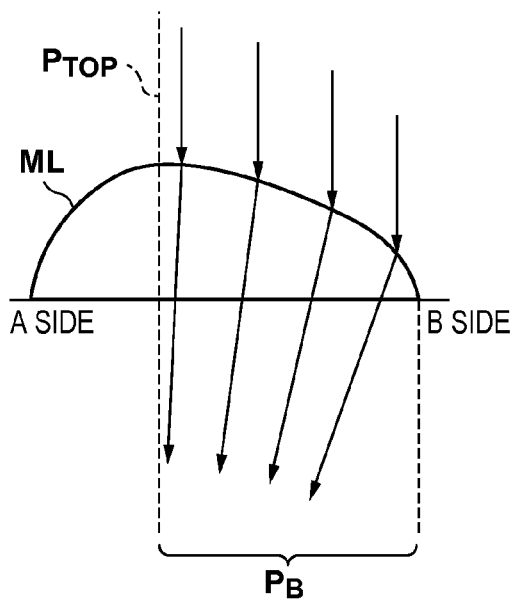

When the top $P_{TOP}$ is located close to the A side, as shown in FIG. 2B, the curvature (average value) of the upper surface in a portion $P_A$ on the A side of the top $P_{TOP}$ of the microlens ML is relatively large. Additionally, as shown in FIG. 2C, the curvature of the upper surface in a portion $P_B$ on the B side of the top $P_{TOP}$ of the microlens ML is smaller than the curvature of the upper surface in the portion $P_A$. As a result, perpendicularly incident light to the portion $P_A$ is refracted to the B side relatively largely, as shown in FIG. 2B. On the other hand, perpendicularly incident light to the portion $P_B$ is refracted to the A side relatively small, as shown in FIG. 2C. Note that the curvature is defined as the reciprocal of a radius of curvature.

The shift amount of the microlens ML and/or the shift amount of the top $P_{TOP}$ of the microlens ML with respect to the photoelectric conversion portion PD in a certain pixel PX may change depending on the position of the pixel PX in the pixel array $A_{PX}$. That is, a pixel PX close to an end of the pixel array $A_{PX}$ can be configured to have a shift amount larger than that of a pixel PX close to the center. The shift amount is set within the range of 0% (exclusive) to 50% (exclusive) of the pixel pitch.

Figure 3:
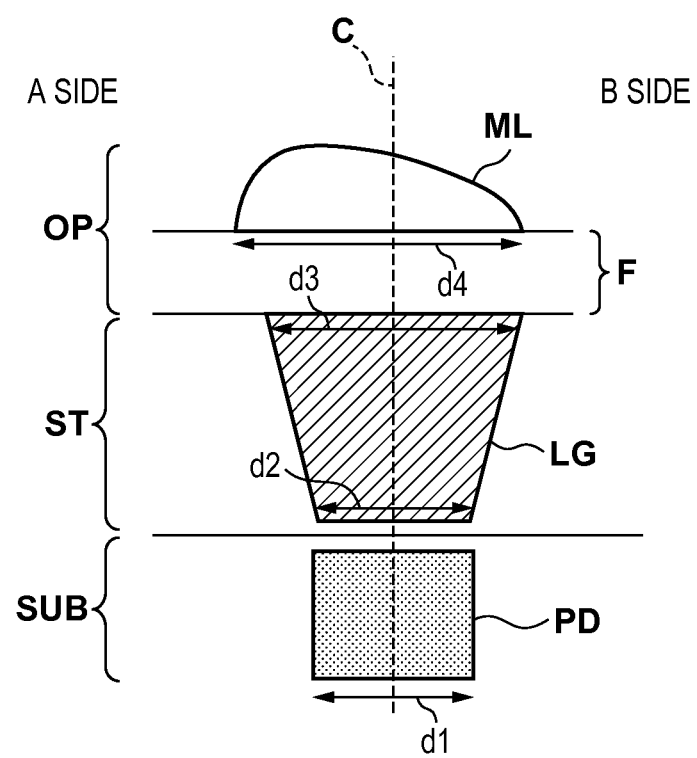
FIG. 3 is a schematic view for explaining an example of the pixel structure.

FIG. 3 is a schematic view for explaining the sizes of the photoelectric conversion portion PD, the light-guide portion LG, and the microlens ML. As shown in FIG. 3, let d1 be the width of the photoelectric conversion portion PD, d2 be the width of the lower surface of the light-guide portion LG, d3 be the width of the upper surface of the light-guide portion LG, and d4 be the width of the microlens ML. At this time, when a relationship given by d1>d2 holds, light that has passed through the light-guide portion LG is almost wholly incident on the photoelectric conversion portion PD, and photoelectric conversion is effectively performed. To increase the incident angle of incident light detectable by the photoelectric conversion portion PD, for example, d3>d2 may hold. When the width d4 is made large, more light can be condensed. Hence, for example, d4>d3 may hold. Note that the photoelectric conversion portion PD is a charge accumulation region (for example, n-type semiconductor region if the charges are electrons) capable of accumulating charges generated by photoelectric conversion. The width d1 of the photoelectric conversion portion PD is, for example, the width on the upper surface of the photoelectric conversion portion PD (upper surface side of the substrate SUB).

FIG. 4A shows optical paths of obliquely incident light in this structure. As described above, the microlens ML is arranged while being shifted to the A side with respect to the photoelectric conversion portion PD (and the light-guide portion LG). Both obliquely incident light to the portion $P_A$ of the microlens ML and obliquely incident light to the portion $P_B$ are guided to the photoelectric conversion portion PD (and the light-guide portion LG).

FIG. 4B shows optical paths of perpendicularly incident light in this structure. As described above, since the curvature of the upper surface in the portion $P_A$ is relatively large, perpendicularly incident light to the portion $P_A$ is refracted to the B side largely. The perpendicularly incident light to the portion $P_A$ is appropriately refracted toward the photoelectric conversion portion PD (and the light-guide portion LG).

Figure 5A:
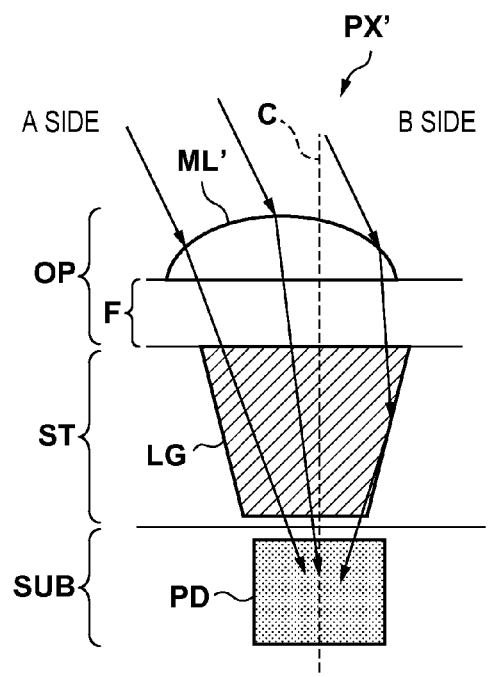
FIGS. 5A to 5C are schematic views for explaining a reference example of the pixel structure and optical paths of incident light in the reference example.
Figure 5B:
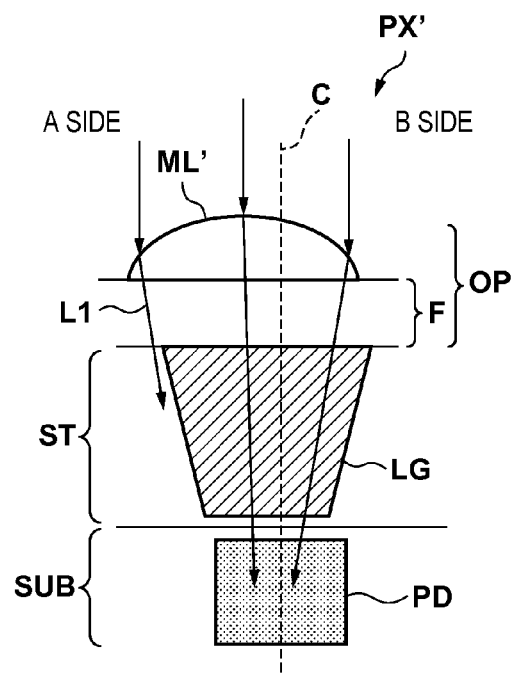

A comparative example will be described here with reference to FIG. 5A, and the like. FIGS. 5A and 5B show the cross sectional structure of a pixel PX' according to the comparative example, like FIGS. 4A and 4B, and the like. The pixel PX' includes a microlens ML' formed to be left-right symmetric. Note that the height of the microlens ML and the height of the microlens ML' are assumed to be equal to each other for the sake of comparison. In the example shown in FIGS. 5A and 5B, the microlens ML' is arranged while being shifted to the A side with respect to the photoelectric conversion portion PD (and the light-guide portion LG) by the same amount as the above-described left-right asymmetric microlens ML.

FIG. 5A shows optical paths of obliquely incident light in the comparative example. Similarly, FIG. 5B shows optical paths of perpendicularly incident light. According to the example shown in FIG. 5A, the microlens ML' is arranged while being shifted to the A side with respect to the photoelectric conversion portion PD (and the light-guide portion LG). Obliquely incident light is guided to the photoelectric conversion portion PD (and the light-guide portion LG) via the microlens ML'. On the other hand, according to the example shown in FIG. 5B, perpendicularly incident light to the A-side end of the microlens ML may become stray light L1 without being guided to the light-guide portion LG.

Figure 5C:
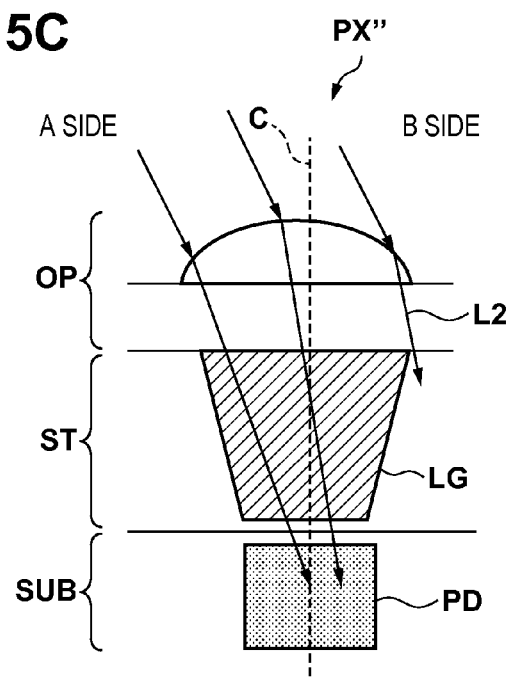

To prevent the stray light L1, the shift amount of the microlens ML' with respect to the photoelectric conversion portion PD (and the light-guide portion LG) may be decreased as compared to the examples of FIGS. 5A and 5B, as in a pixel PX" shown in FIG. 5C as another comparative example. In this example, however, perpendicularly incident light to the B-side end of the microlens ML' may become stray light L2 without being guided to the light-guide portion LG.

On the other hand, according to this embodiment, both obliquely incident light and perpendicularly incident light can appropriately be refracted toward the light-guide portion LG and made incident on the photoelectric conversion portion PD. Hence, this structure is advantageous in improving pixel sensitivity.

FIG. 6A is a schematic view for explaining an example of an array $A_{ML}$ (to be referred to as a "microlens array $A_{ML}$" hereinafter) of the plurality of microlenses ML arranged in correspondence with the plurality of pixels PX. As described above, each microlens ML in the peripheral region R2 is arranged while being shifted to the side of the central region R1 with respect to the photoelectric conversion portion PD, and formed to be left-right asymmetric such that the top $P_{TOP}$ is shifted to the side of the central region R1. According to the example shown in FIG. 6A, the microlens ML has a shape having a major axis parallel to the shift direction (in other words, a shape elongated in the shift direction) when viewed from the upper side. In addition, the microlens ML has a so-called tear drop shape such that the width in a direction crossing the shift direction has the maximum value on the side of the central region R1 when viewed from the upper side.

Note that each microlens ML in the central region R1 is located almost immediately above a corresponding photoelectric conversion portion PD and has an almost circular shape when viewed from the upper side.

The microlens ML in the peripheral region R2 may have a shape necessary to form a shape with the top $P_{TOP}$ shifted to the side of the central region R1, for example, a round triangular shape or trapezoidal shape when viewed from the upper side, in addition to the above example. FIG. 6B is a schematic view for explaining another example of the microlens array $A_{ML}$. According to the example shown in FIG. 6B, the microlens ML has a shape that is almost flat on the side of the central region R1 but round on the opposite side when viewed from the upper side. According to this example as well, the microlens ML can have a shape with the top $P_{10}$ shifted to the side of the central region R1.

The microlens array $A_{ML}$ may be formed by, for example, forming the lens members of the microlenses ML and then developing them by exposure processing using a tone mask. Alternatively, the microlens array $A_{ML}$ may be formed by, for example, patterning the lens members into a triangular pyramidal shape with its apex shifted to the side of the central region R1 and then performing heating processing. Otherwise, the microlens array $A_{ML}$ may be formed by another known semiconductor manufacturing method.

Concerning the so-called gapless microlens array $A_{ML}$ in which the adjacent microlenses ML are in contact with each other, the shape of the microlens ML corresponding to the unit pixel PX will be described below with reference to FIGS. 7A and 7B as another example of the microlens array $A_{ML}$. According to this example, the area of the microlens ML per unit pixel PX can be increased, and the incident light condensation efficiency can be improved.

The X direction in FIGS. 7A and 7B is defined as the above-described shift direction (the shift direction of the microlens ML and the top $P_{TOP}$), the Y direction is defined as a direction that is parallel to the upper surface of the microlens array $A_{ML}$ and crosses the X direction, and the Z direction is defined as a direction perpendicular to the upper surface of the microlens array $A_{ML}$. FIG. 7A is a plan view for explaining the shape of the microlens ML, and FIG. 7B is a cross sectional view in the X direction.

Let p be the pixel pitch. At this time, the left end of the microlens ML in FIGS. 7A and 7B is represented by X=x0=0, and the right end is represented by X=x3=p. The height of the top $P_{TOP}$ of the microlens ML is h1. If the coordinate of the top $P_{TOP}$ in the X direction is X=x1, x1<p/2. If the width (width in the Y direction) of the microlens ML at X=x1 is d1, d1≈p. This also applies to a vicinity of X=x1. When the height of the microlens ML at X=x2 in the end region on the right side in FIGS. 7A and 7B is h2, and the width of the microlens ML is d2, h2<H1, and d2<d1. Within the range of x0<X<x3, the upper surface of the microlens ML on the cross section in the Y direction preferably has an almost arcuated shape. Hence, in this example, the curvature of the upper surface of the microlens ML is maximized at X=x1. The closer the position moves from X=x1 to X=x0 or x3, the smaller the curvature is.

As described above, according to this embodiment, it is possible to appropriately refract both obliquely incident light and perpendicularly incident light toward the light-guide portion LG and make them incident on the photoelectric conversion portion PD and advantageously improve the pixel sensitivity.

Note that for easy understanding, the embodiment has been described by referring to the cross sectional structure taken along the cut line A-B in the row direction. This description also applies to a cross sectional structure taken along a cut line in a direction crossing the row direction.

Additionally, in this embodiment, the position and shape of the microlens ML have mainly been described. The position and shape of another member may be changed as needed. For example, in this embodiment, a structure in which the light-guide portion LG is not shifted with respect to the photoelectric conversion portion PD has been described. However, the shape or structure of the light-guide portion LG of a certain pixel PX may be changed in accordance with the position of the pixel PX. In addition, for example, the light-guide portion LG may have a structure in which the inclination of the side surface on the A side is gentler than the inclination of the side surface on the B side (that is, when the angle made by the upper surface of the substrate SUB and the side surface of the light-guide portion LG is defined as an inclined angle, the inclined angle on the A side is smaller than the inclined angle on the B side).

Second Embodiment

Figure 8B:
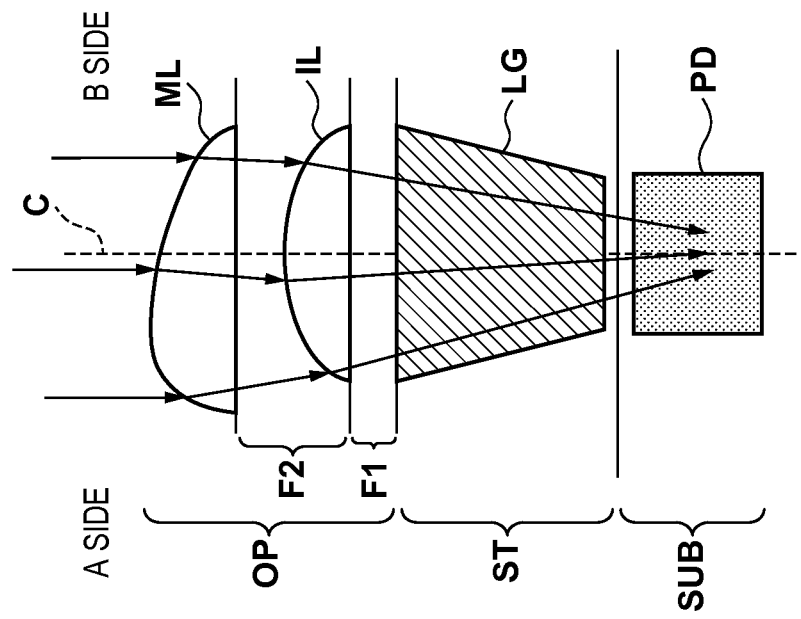
FIGS. 8A and 8B are schematic views for explaining an example of the pixel structure.
Figure 8A:
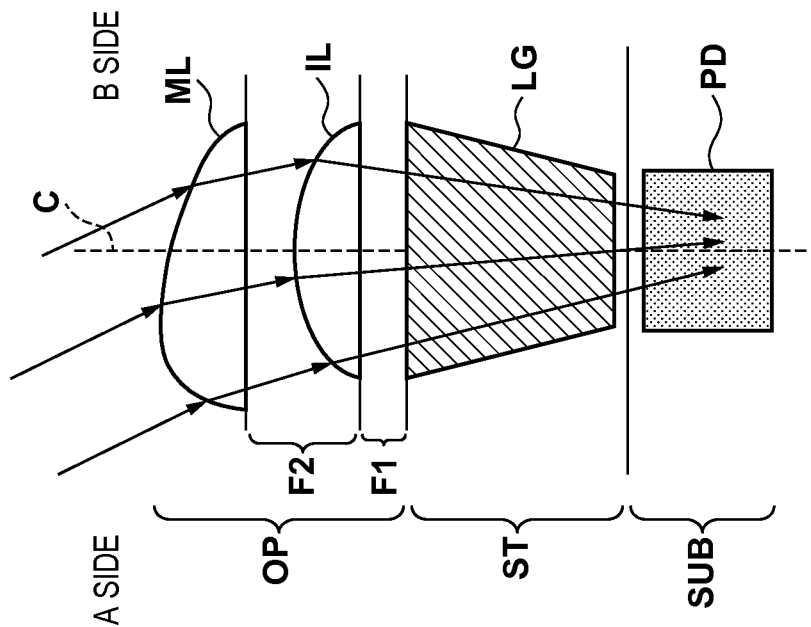

A pixel (to be referred to as a pixel PX2) according to the second embodiment will be described with reference to FIGS. 8A and 8B. This embodiment is different from the above-described first embodiment mainly in that the pixel PX2 further includes an inner lens IL (or inter-layer lens). The inner lens IL is arranged on, for example, a translucent member F1 such as a planarization film formed on a structure ST, and the above-described microlens ML is arranged on a translucent member F2 such as a planarization film formed on the inner lens IL.

According to this embodiment, incident light condensed by the microlens ML is further condensed by the inner lens IL and guided to a light-guide portion LG. Hence, according to this embodiment, it is possible to obtain the same effect as in the above-described first embodiment and also prevent mixture of colors between adjacent pixels and advantageously improve the condensation efficiency.

Although not illustrated, the inner lens IL may be arranged while being shifted to the A side with respect to a photoelectric conversion portion PD and/or formed to be left-right asymmetric such that its top is shifted to the A side, like the above-described microlens ML.

Third Embodiment

Figure 9:
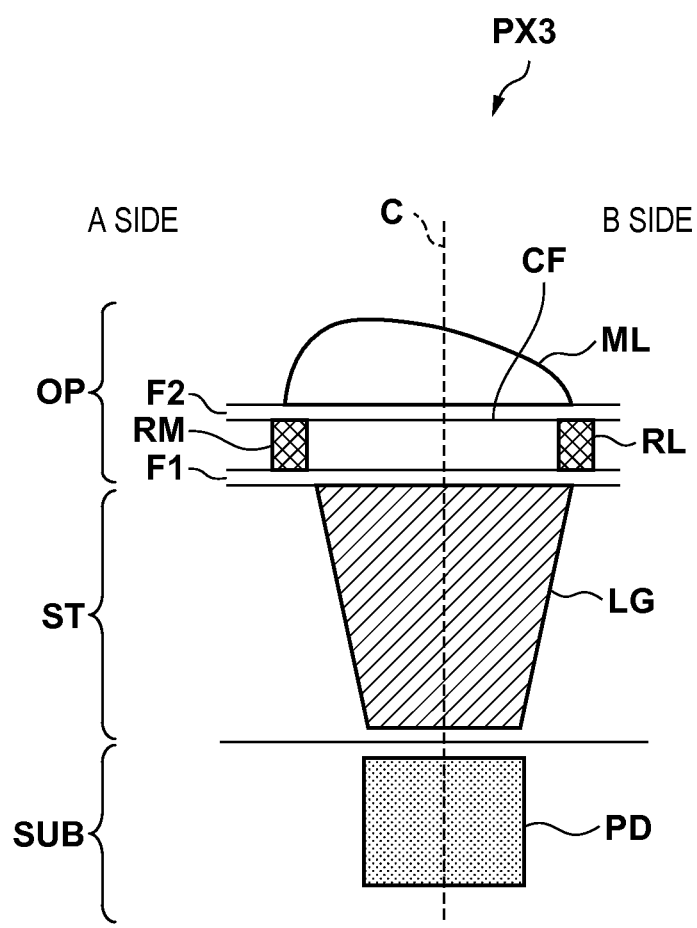
FIG. 9 is a schematic view for explaining an example of the pixel structure.

A pixel (to be referred to as a pixel PX3) according to the third embodiment will be described with reference to FIG. 9. This embodiment is different from the above-described first embodiment mainly in that a member RM that has a light-reflective property or light-shielding property and is configured to prevent mixture of colors between adjacent pixels is arranged in an optical system OP. The member RM is formed on, for example, a translucent member F1 such as a planarization film formed on a structure ST. The member RM can be formed between adjacent pixels so as to partition each pixel PX3. The member RM can be made of a metal such as aluminum, copper, or tungsten, and may be made of silicon oxide or an air gap. A color filter CF of a color (for example, red, green, or blue) corresponding to the position of the pixel PX3 may be arranged between the members RM.

The member RM may be arranged while being shifted to the A side with respect to a photoelectric conversion portion PD in correspondence with the shift of the above-described microlens ML or top $P_{TOP}$.

According to this embodiment, leakage of light to adjacent pixels can be prevented by the member RM having a light-reflective property or light-shielding property and arranged between the adjacent pixels. Hence, according to this embodiment, it is possible to obtain the same effect as in the above-described first embodiment and also advantageously prevent mixture of colors between adjacent pixels.

Fourth Embodiment

The fourth embodiment will be described with reference to FIGS. 10A to 10C. The above-described microlens ML may be applied to a focus detection pixel in addition to an imaging pixel.

Figure 10A:
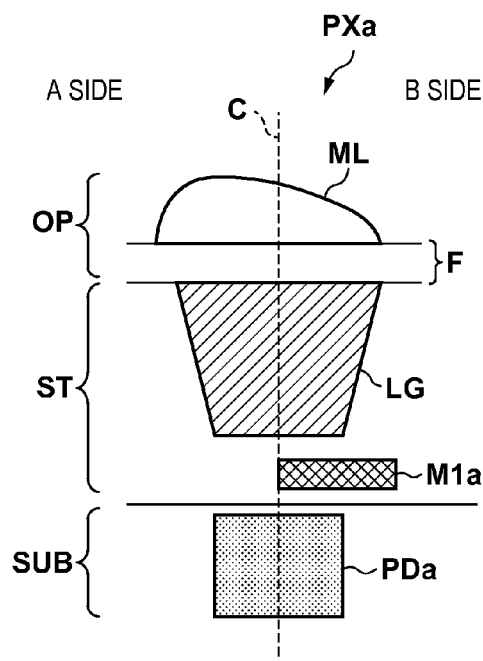
FIGS. 10A to 10C are schematic views for explaining an example of the pixel structure.

FIG. 10A shows an example of the arrangement of a focus detection pixel PXa. The pixel PXa further includes a light-shielding member M1a configured to limit incident light. The light-shielding member M1a is arranged between a substrate SUB and a light-guide portion LG from a line C to the B side. The light-shielding member M1a is made of, for example, a metal and arranged in a first interconnection layer (interconnection layer closest to the substrate SUB). According to this arrangement, the pixel PXa detects a light beam on the B side out of incident light to a microlens ML by a photoelectric conversion portion PDa.

Figure 10B:
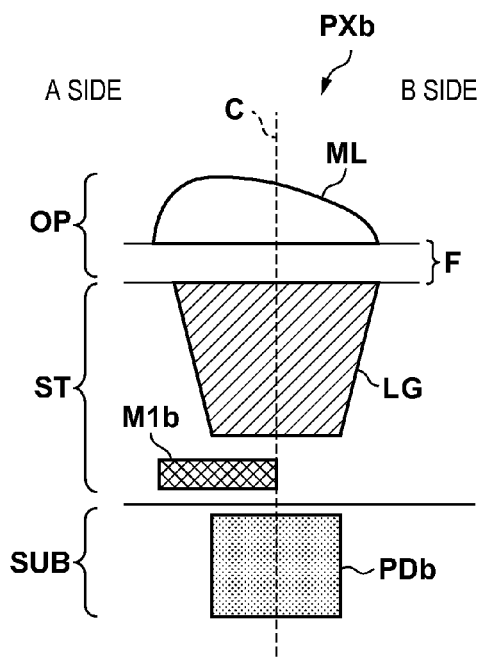

Similarly, FIG. 10B shows an example of the arrangement of a focus detection pixel PXb. The pixel PXb further includes a light-shielding member M1b arranged between the substrate SUB and the light-guide portion LG from the line C to the A side. According to this arrangement, the pixel PXab detects a light beam on the A side out of incident light to the microlens ML by a photoelectric conversion portion PDb.

The above-described pixels PXa and PXb are paired, and focus detection based on a phase difference detection method can be performed using these pixel signals.

Figure 10C:
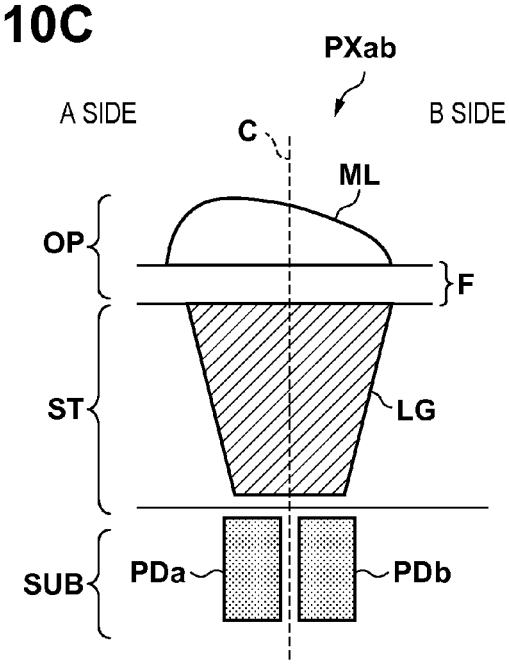

FIG. 10C shows an example of the arrangement of a focus detection pixel PXab. The pixel PXab further includes the pair of photoelectric conversion portions PDa and PDb, and detects the above-described light beam on the B side and the light beam on the A side by the photoelectric conversion portions PDa and PDb, respectively. According to this arrangement as well, focus detection based on a phase difference detection method can be performed.

As described above, the microlens ML is applicable not only to an imaging pixel but also to a focus detection pixel. According to this embodiment, the same effect as in the above-described first embodiment can be obtained even for the focus detection pixel.

Fifth Embodiment

Figure 11:
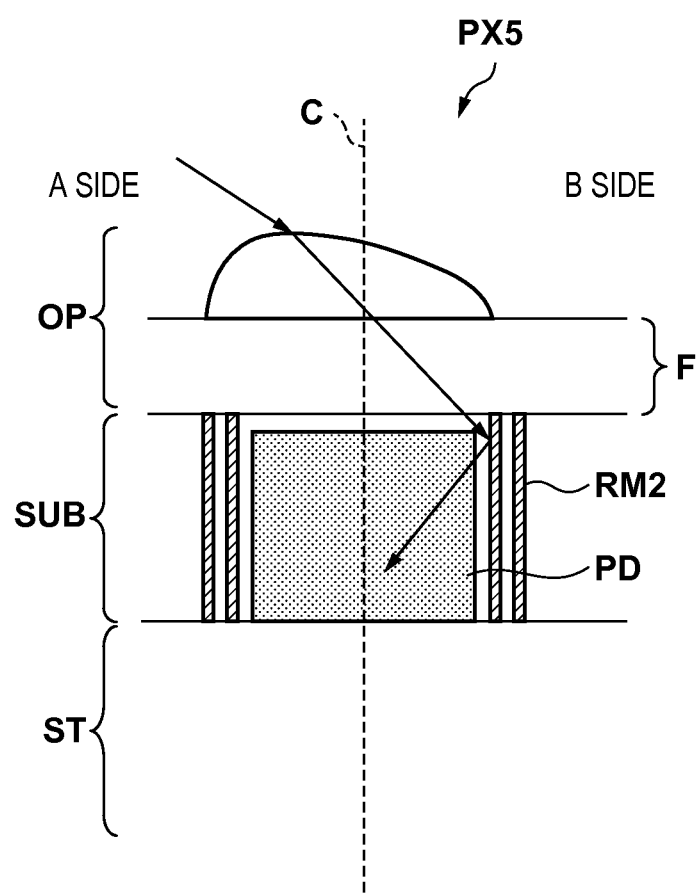
FIG. 11 is a schematic view for explaining an example of the pixel structure.

The fifth embodiment will be described with reference to FIG. 11. The above-described microlens ML may be applied to a back-side illumination solid-state image sensing device. In the back-side illumination solid-state image sensing device, an optical system OP, a substrate SUB, and a structure ST are arranged sequentially from the light incident side (sequentially from the upper side of FIG. 11).

In this example, the above-described light-guide portion LG formed in the structure ST is not located between the optical system OP and the substrate SUB. For this reason, a reflecting member RM2 is provided in the substrate SUB so as to, for example, surround a photoelectric conversion portion PD. The reflecting member RM2 can reflect incident light that has passed through a microlens ML toward the photoelectric conversion portion PD and thus prevent mixture of colors between adjacent pixels.

The reflecting member RM2 can be made of, for example, at least one of polysilicon, silicon oxide, a metal, and an air gap. For example, the reflecting member RM2 includes an element isolation portion (deep trench isolation) formed from a polysilicon member and silicon oxide members formed on both sides of the polysilicon member, as shown in FIG. 11. The element isolation portion may be formed from the upper surface to the lower surface of the substrate SUB.

As described above, the microlens ML is also applicable to a back-side illumination solid-state image sensing device. According to this embodiment, it is possible to obtain the same effect as in the above-described first embodiment and also advantageously prevent mixture of colors between adjacent pixels.

OTHER EMBODIMENTS

Several preferred embodiments have been described above. The present invention is not limited to these embodiments, and the embodiments may partially be changed, or their features may be combined in accordance with the purpose or the like.

A solid-state image sensing device included in an imaging system represented by a camera has been described in the above embodiments. The concept of the imaging system includes not only devices mainly aiming at shooting but also apparatuses (for example, personal computer or portable terminal) having an auxiliary shooting function. The imaging system can include the solid-state image sensing device described in the above embodiments and a processing unit that processes a signal from the solid-state image sensing device. The processing unit can include, for example, an A/D converter and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-183495, filed Sep. 9, 2014, which is hereby incorporated by reference herein in its entirety.

What is claimed is:

1. A solid-state image sensing device including a pixel array in which a plurality of pixels are arranged,
   wherein each of the plurality of pixels comprises:
      a photoelectric conversion portion arranged in a substrate;
      a microlens arranged above the photoelectric conversion portion;
      an insulating member arranged between the substrate and the microlens; and
      a light-guide portion configured to guide incident light that has passed through the microlens to the photoelectric conversion portion, the light-guide portion being formed in the insulating member,
   wherein the pixel array includes a central region and a peripheral region,
   wherein in a pixel located in the peripheral region:
      the microlens is arranged as being shifted towards a side of the central region in a shift direction with respect to the photoelectric conversion portion,
      in a cross-section along the shift direction, the microlens has an asymmetric shape with respect to a central line that is perpendicular to an upper surface of the substrate and passes through a center of the microlens, and a highest portion of the microlens is located on the side of the central region with respect to the central line, and
      in the cross-section, the highest portion of the microlens having the asymmetric shape is located between a line that is perpendicular to the upper surface of the substrate and passes through a center of the photoelectric conversion portion and a line that is perpendicular to the upper surface of the substrate and passes through an end, on a side of the central region with respect to the central line, of an upper surface of the light-guide portion.

2. The device according to claim 1, wherein the plurality of pixels include a first pixel located in the peripheral region and a second pixel in the peripheral region, the second pixel being located closer to the central region than the first pixel, and
   wherein an amount of the shift of the highest portion of the microlens of the first pixel is greater than an amount of the shift of the highest portion of the microlens of the second pixel.

3. The device according to claim 1, wherein for the microlens of a pixel located in the peripheral region, an average value of curvatures of an upper surface of a portion closer to the side of the central region than the highest portion is greater than the average value of the curvatures of the upper surface of a remaining portion.

4. The device according to claim 1, wherein the microlens of a pixel located in the peripheral region has a shape having a major axis parallel to the shift direction when viewed from an upper side, and a width of the microlens in a direction crossing the shift direction has a maximum value on the side of the central region.

5. The device according to claim 1, wherein with d1 being a width of the photoelectric conversion portion of the pixel, and d2 being a width of a lower surface of the light-guide portion in the cross-section, a relationship of d1>d2 holds.

6. The device according to claim 1, wherein with d3 being a width of an upper surface of the light-guide portion of the pixel and d4 being a width of the microlens of the pixel in the cross-section, a relationship of d4>d3 holds.

7. The device according to claim 6, wherein a relationship of d3>d2 further holds.

8. The device according to claim 1, wherein each of the plurality of pixels further comprises an inner lens arranged between the photoelectric conversion portion and the microlens, and
   wherein in a pixel located in the peripheral region, the inner lens is arranged as being shifted toward the side of the central region with respect to the photoelectric conversion portion.

9. The device according to claim 1, wherein each of the plurality of pixels further comprises an inner lens arranged between the photoelectric conversion portion and the microlens, and
   wherein in a pixel located in the peripheral region, in the cross-section along the shift direction, the inner lens has an asymmetric shape with respect to a central line that is perpendicular to the upper surface of the substrate and passes through a center of the inner lens, and a highest portion of the inner lens is located on the side of the central region with respect to the central line of the inner lens.

10. The device according to claim 1, further comprising a member that has at least one of a light-reflective property and a light-shielding property and is configured to prevent mixture of colors between adjacent pixels,
    wherein the member is arranged between the photoelectric conversion portion and the microlens along an outer edge of the microlens when an upper surface of the substrate is viewed from an upper side.

11. The device according to claim 1, wherein the plurality of pixels include a focus detection pixel, the focus detection pixel further comprising a light-shielding member configured to limit incident light that has passed through the microlens.

12. The device according to claim 11, wherein the reflecting member is made of at least one of polysilicon, silicon oxide, a metal, and an air gap.

13. The device according to claim 1, wherein the solid-state image sensing device comprises a back-side illumination solid-state image sensing device, and
wherein the substrate includes a reflecting member that surrounds the photoelectric conversion portion so as to reflect incident light that has passed through the microlens of each pixel toward the photoelectric conversion portion.

14. The device according to claim 1, wherein the microlens has a shape that is flat on the side of the central region and is round on an opposite side of the side of the central region.

15. The device according to claim 1, wherein the microlens has a shape whose width in a direction crossing the shift direction has a maximum value on the side of the central region.

16. A camera comprising a solid-state image sensing device and a processing unit configured to process a signal output from the solid-state image sensing device,
wherein the solid-state image sensing device includes a pixel array in which a plurality of pixels are arranged,
wherein each of the plurality of pixels comprises:
a photoelectric conversion portion arranged in a substrate;
a microlens arranged above the photoelectric conversion portion;
an insulating member arranged between the substrate and the microlens; and
a light-guide portion configured to guide incident light that has passed through the microlens to the photoelectric conversion portion, the light-guide portion being formed in the insulating member,
wherein the pixel array includes a central region and a peripheral region,
wherein in a pixel located in the peripheral region:
the microlens is arranged as being shifted towards a side of the central region in a shift direction with respect to the photoelectric conversion portion,
in a cross-section along the shift direction, the microlens has an asymmetric shape with respect to a central line that is perpendicular to an upper surface of the substrate and passes through a center of the microlens, and a highest portion of the microlens is located on the side of the central region with respect to the central line, and
in the cross-section, the highest portion of the microlens having the asymmetric shape is located between a line that is perpendicular to the upper surface of the substrate and passes through a center of the photoelectric conversion portion and a line that is perpendicular to the upper surface of the substrate and passes through an end, on a side of the central region with respect to the central line, of an upper surface of the light-guide portion.

\* \* \* \* \*